(12) United States Patent
Ryan (10) Patent No.: US 7,961,501 B1
(45) Date of Patent: Jun. 14, 2011

(54) RADIATION SENSORS AND SINGLE-EVENT-EFFECTS SUPPRESSION DEVICES

(75) Inventor: Kevin Michael Patrick Ryan, Colorado Springs, CO (US)

(73) Assignee: Ryan Technologies, LLC, Colorado Springs, CO (US)

( * ) Notice: Subject to any disclaimer, the term of this patent is extended or adjusted under 35 U.S.C. 154(b) by 119 days.

(21) Appl. No.: 12/537,958

(22) Filed: Aug. 7, 2009

Related U.S. Application Data (63) Continuation of application No. 12/171,183, filed on Jul. 10, 2008, now abandoned.

(51) Int. Cl.
*G11C 11/00* (2006.01)

(52) U.S. Cl. ............... 365/154; 365/189.05; 365/230.08

(58) Field of Classification Search .................. 365/154, 365/189.05, 230.08
See application file for complete search history.

(56) References Cited

U.S. PATENT DOCUMENTS

| | | |
|---|---|---|
| 4,809,226 A | 2/1989 | Ochoa, Jr. |
| 4,912,675 A | 3/1990 | Blake et al. |
| 4,914,629 A | 4/1990 | Blake et al. |
| 4,956,814 A | 9/1990 | Houston |
| 5,046,044 A | 9/1991 | Houston et al. |
| 5,111,429 A | 5/1992 | Whitaker |
| 5,204,990 A | 4/1993 | Blake et al. |
| 5,311,070 A | 5/1994 | Dooley |
| 5,504,703 A | 4/1996 | Bansal |
| 5,657,267 A | 8/1997 | Levi |
| 5,835,420 A * | 11/1998 | Lee et al. ................. 365/189.09 |
| 5,905,290 A | 5/1999 | Houston |
| 5,917,212 A | 6/1999 | Blake et al. |
| 6,208,554 B1 | 3/2001 | Phan et al. |
| 6,215,694 B1 | 4/2001 | Li et al. |
| 6,259,643 B1 | 7/2001 | Li |
| 6,275,080 B1 | 8/2001 | Phan et al. |
| 6,327,176 B1 | 12/2001 | Li et al. |
| 6,369,630 B1 | 4/2002 | Rockett |
| 6,417,710 B1 | 7/2002 | Bartholet |
| 6,487,134 B2 | 11/2002 | Thoma et al. |
| 6,696,873 B2 | 2/2004 | Hazucha et al. |
| 6,735,110 B1 | 5/2004 | Lesea |
| 6,775,178 B2 | 8/2004 | Liu et al. |
| 6,809,957 B2 | 10/2004 | Lesea |
| 6,822,894 B1 | 11/2004 | Costello et al. |

(Continued)

*Primary Examiner* — Son Dinh
*Assistant Examiner* — Nam T Nguyen
(74) *Attorney, Agent, or Firm* — Blakely Sokoloff Taylor & Zafman LLP (57) ABSTRACT

The present invention provides a Single-Event-Upset (SEU) and Single-Event-Gate-Rupture (SEGR) protection against incident radiation for any bi-stable circuit either in one state, having a 2 transistor, 1 capacitor integrated circuit coupled to a bi-stable circuit's outputs, or in both states, having a 4 transistor, 2 capacitor integrated circuit coupled to the bi-stable circuit's outputs. The protection against SEU and SEGR is achieved by the 2T1C or the 4T2C circuits, by providing the opposite drive to the SEU or SEGR event through capacitive coupling, and shunting electron-hole pair current, created by an ion tracking through the bi-stable circuit, into the power supplies. The 2T1C integrated circuit architecture, which only protects bi-stable circuits in one state, is to allow the bi-stable circuit to be a Single-Event-Upset (SEU) detector by capturing the effect of an incident ion and store that state. The 2T1C architecture, while protecting the bi-stable circuit after it has been affected by incident radiation, can alert the system the bi-stable integrated circuit is embedded in, to compensate or at be aware that an Single-Event-Upset has occurred. The purpose of the 4T2C integrated circuit architecture, which protects bi-stable circuits in both stable states, is to allow for critical data/state retention in any radiation environment, while not effecting speed of operation.

22 Claims, 4 Drawing Sheets

U.S. PATENT DOCUMENTS

| | | |
|---|---|---|
| 6,914,804 B2 | 7/2005 | Lesea |
| 6,982,451 B1 | 1/2006 | Voogel et al. |
| 7,036,059 B1 | 4/2006 | Carmichael et al. |
| 7,139,190 B1 | 11/2006 | de Jong |
| 7,161,404 B2 | 1/2007 | Hazucha et al. |
| 7,200,031 B2 | 4/2007 | Liu et al. |
| 7,283,410 B2 | 10/2007 | Hsu et al. |
| 7,310,759 B1 | 12/2007 | Carmichael et al. |
| 7,383,479 B1 | 6/2008 | Carmichael et al. |
| 7,397,692 B1 | 7/2008 | Cannon et al. |
| 7,425,855 B2 | 9/2008 | Chen et al. |
| 7,452,765 B1 | 11/2008 | Voogel et al. |
| 7,486,123 B2 | 2/2009 | Chen et al. |
| 2002/0018372 A1 | 2/2002 | Thoma et al. |
| 2003/0189847 A1 | 10/2003 | Liu et al. |
| 2004/0130351 A1 | 7/2004 | Hazucha et al. |
| 2004/0165417 A1 | 8/2004 | Lesea |
| 2004/0165418 A1 | 8/2004 | Lesea |
| 2006/0133134 A1 | 6/2006 | Doyle et al. |
| 2006/0209588 A1 | 9/2006 | Liu et al. |
| 2007/0013426 A1 | 1/2007 | Chen et al. |
| 2007/0165446 A1 | 7/2007 | Oliva et al. |
| 2007/0211527 A1 | 9/2007 | Hsu et al. |
| 2008/0111606 A1 | 5/2008 | Chen et al. |
| 2008/0144348 A1 | 6/2008 | Cannon et al. |
| 2009/0034312 A1 | 2/2009 | Lawrence et al. |

* cited by examiner

RADIATION SENSORS AND SINGLE-EVENT-EFFECTS SUPPRESSION DEVICES

CROSS-REFERENCE TO RELATED APPLICATION(S)

This application is a continuation of U.S. patent application Ser. No. 12/171,183 filed Jul. 10, 2008 now abandoned.

BACKGROUND OF THE INVENTION

1. Field of the Invention

The present invention relates to an integrated circuit architecture, that when coupled to a bi-stable circuit, prevents the bi-stable circuit from being effected by incident radiation that causes Single-Event-Upsets (SEU) and/or Single-Event-Gate-Rupture (SEGR).

2. Prior Art

Bi-stable circuits, and particularly CMOS bi-stable flip-flops, latches, and static-random-access-memories (SRAM), that have the ability to self-re-enforce a programmed state (such as Q=1 and Q_bar=0, or BIT=1 and BIT_bar=0) to be referred to later by the system that programmed the present state are well known in the art. A typical application for a bi-stable flip-flop or latch is in combinational logic using previous and present states, such as D type flip flops, SR latches, and JK flip flops. Another typical example for a bi-stable circuit is in a static random access memory cell, which is generally used in sizable arrays that remember programmed data as long as power is applied. However, bi-stable circuits are also used in many different functional blocks and applications, and then usually implemented in integrated circuits. The general purpose of bi-stable circuits is to remain in one of two possible programmed states, however when used in space, radiation that is naturally present in space can become incident on the integrated bi-stable circuit and cause the bi-stable circuit to change to the opposite state or change to a state other than what it was programmed to remain. Incident radiation changing the programmed state of a bi-stable circuit can cause undesirable effects to the system that uses the programmed state of the bi-stable circuit for system operations. An example of this would be static-random-access-memory in a satellite used to provide navigation information, or secure military communication, that when the static-random-access-memory is unknowingly flipped to the opposite state by incident radiation, provides incorrect navigation information, or incorrect and communication for military command and control. Therefore it is desirable to provide protection to space-based bi-stable circuits that prevents unknown and undesirable state changes to the bi-stable circuit due to incident radiation. Most existing bi-stable circuits that are hardened, or less susceptible to the effects of incident radiation in space, are manufactured as integrated circuits in special fabrication process that are expensive and not always adequate in providing acceptable levels of protection for the bi-stable circuit in space. The expense of special fabrication processes that manufacture hardened bi-stable circuits drive the cost of hardened circuits very high. Some designs exist that protect bi-stable circuits from unknown and undesirable state changes due to incident radiation and do not need to be manufactured in special fabrication processes and are known as radiation-hardened-by-design (RHBD) circuits. The RHBD bi-stable circuits are large (smallest most effective RHBD SRAM consists of 12 transistors), and are slow due to the size and complexity of design required to make a bi-stable circuit RHBD. Therefore, what is desired is a small, fast, generic integrated circuit architecture that can be coupled to any integrated bi-stable circuit making it immune to unknown and unwanted circuit changes due to incident radiation, that can be manufactured in a typical, non-specialized, in-expensive, integrated circuit manufacturing process.

BRIEF DESCRIPTION OF THE DRAWINGS

Many features and objects of the present invention and the manner of attaining them will become apparent and the invention itself will be best understood by reference to the following description of preferred embodiments taken in conjunction with the accompanying drawings, wherein.

DETAILED DESCRIPTION OF THE PREFERRED EMBODIMENTS

In accordance with the present invention there is provided an integrated circuit architecture, consisting of 4 transistors and 2 capacitors (4T2C), that when coupled to the output nodes of any bi-stable circuit, the bi-stable circuit will be completely immune to the adverse effects of incident radiation that causes Single-Event-Upset (SEU) and Single-Event-Gate-Rupture (SEGR). Also in accordance with the present invention there is provided an integrated circuit architecture, consisting of 2 transistors and 1 capacitor (2T1C), that when coupled to the output nodes of a bi-stable circuit, the bi-stable circuit will be completely immune to the adverse effects of incident radiation that causes Single-Event-Upset (SEU) and Single-Event-Gate-Rupture (SEGR) in one of the two possible bi-stable circuit states. The 2 transistor, 1 capacitor (2T1C) integrated circuit architecture is intended to be used as a Single-Event-Upset detector since it only protects the bi-stable circuit in one state. For example, when the 2 transistor, 1 capacitor circuit is coupled to a bi-stable circuit in such a way that the circuit is not protected, when incident radiation changes the state of the bi-stable circuit, the state created by incident radiation will be captured and protected until purposefully reset by the system. This serves as a very valuable Single-Event-Upset detector that is used for alerts and allows for possible compensation of other parts of the integrated circuit.

Following is a list of reference numerals used in the Figures:

| FIG. | Nomenclature | Description |
|---|---|---|
| 1 | 4T2C | Four-Transistor Two-Capacitor Radiation Single-Event-Effects Suppression Device |
| 1 | 2T1C_1 | Two-Transistor One-Capacitor Radiation Single-Event-Effects Suppression Device |
| 1 | 2T1C_2 | Two-Transistor One-Capacitor Radiation Single-Event-Effects Suppression Device |
| 1 | N1 | N-type Transistor Device |
| 1 | P1 | P-type Transistor Device |
| 1 | N2 | N-type Transistor Device |
| 1 | P2 | P-type Transistor Device |
| 1 | C1 | Capacitor Device |
| 1 | C2 | Capacitor Device |
| 1 | Cont1 | Optional Capacitor Device Control Node |
| 1 | Cont2 | Optional Capacitor Device Control Node |
| 1 | CS1 | Common Source Node |
| 1 | CS2 | Common Source Node |
| 1 | Q | Bi-Directional Input/Output |
| 1 | Q_BAR | Bi-Directional Input/Output |
| 1 | VD_N | High Power Supply |
| 1 | VD_P | Low Power Supply |
| 2 | Peripheral SRAM | Peripheral Bi-Stable Circuit in SRAM Configuration |
| 2 | FF | Bi-Stable Circuit |
| 2 | Q | Bi-Directional Input/Output |
| 2 | Q_BAR | Bi-Directional Input/Output |
| 2 | SP1 | Series Pass Element |
| 2 | SP2 | Series Pass Element |
| 2 | WR | Write/Read Control Signal |
| 2 | BIT LINE | Bi-Directional Input/Output |
| 2 | BIT_BAR LINE | Bi-Directional Input/Output |
| 2 | 4T2C | Four-Transistor Two-Capacitor Radiation Single-Event-Effects Suppression Device |
| 2 | 2T1C1 | Two-Transistor One-Capacitor Radiation Single-Event-Effects Suppression Device |
| 2 | 2T1C 2 | Two-Transistor One-Capacitor Radiation Single-Event-Effects Suppression Device |
| 2 | N1 | N-type Transistor Device |
| 2 | P1 | P-type Transistor Device |
| 2 | N2 | N-type Transistor Device |
| 2 | P2 | P-type Transistor Device |
| 2 | C1 | Capacitor device |
| 2 | C2 | Capacitor device |
| 2 | Cont1 | Optional Capacitor device Control Node |
| 2 | Cont2 | Optional Capacitor device Control Node |
| 2 | CS1 | Common Source Node |
| 2 | CS2 | Common Source Node |
| 2 | VD_N | High Power Supply |
| 2 | VD_P | Low Power Supply |
| 3 | Peripheral FF/LATCH | Peripheral Bi-Stable Circuit in a Flip-Flop or LATCH Configuration |
| 3 | LG1 | Logic Gate(s) |
| 3 | LG2 | Logic Gate(s) |
| 3 | IN1_1 to IN1_n | 1 to n optional inputs |
| 3 | IN2_1 to IN1_e | 1 to e optional inputs |
| 3 | OUT1_1 to OUT1_m | 1 to m optional outputs |
| 3 | OUT2_1 to OUT2_f | 1 to f optional outputs |
| 3 | Q | Bi-Directional Input/Output |
| 3 | Q_BAR | Bi-Directional Input/Output |
| 3 | 4T2C | Four-Transistor Two-Capacitor Radiation Single-Event-Effects Suppression Device |
| 3 | 2T1C_1 | Two-Transistor One-Capacitor Radiation Single-Event-Effects Suppression Device |
| 3 | 2T1C_2 | Two-Transistor One-Capacitor Radiation Single-Event-Effects Suppression Device |
| 3 | N1 | N-type Transistor Device |
| 3 | P1 | P-type Transistor Device |
| 3 | N2 | N-type Transistor Device |
| 3 | P2 | P-type Transistor Device |
| 3 | C1 | Capacitor device |
| 3 | C2 | Capacitor device |
| 3 | Cont1 | Optional Capacitor device Control Node |
| 3 | Cont2 | Optional Capacitor device Control Node |
| 3 | CE1 | Common Emitter Node |
| 3 | CE2 | Common Emitter Node |
| 3 | VD_N | High Power Supply |
| 3 | VD_P | Low Power Supply |
| 4 | Peripheral FF/Latch | Peripheral Bi-Stable Circuit in a Flip-Flop or LATCH Configuration |
| 4 | LG1 | Logic Gate(s) |
| 4 | LG2 | Logic Gate(s) |
| 4 | IN1_1 to IN1_n | 1 to n optional inputs |
| 4 | IN2_1 to IN1_e | 1 to 3 optional inputs |
| 4 | OUT1_1 to OUT1_m | 1 to m optional outputs |
| 4 | OUT2_1 to OUT2_f | 1 to f optional outputs |
| 4 | Q | Bi-Directional Input/Output |
| 4 | Q_BAR | Bi-Directional Input/Output |
| 4 | 4T2C | Four-Transistor Two-Capacitor Radiation Single-Event-Effects Suppression Device |
| 4 | 2T1C1 | Two-Transistor One-Capacitor Radiation Single-Event-Effects Suppression Device |
| 4 | 2T1C 2 | Two-Transistor One-Capacitor Radiation Single-Event-Effects Suppression Device |
| 4 | N1 | N-type Transistor Device |
| 4 | P1 | P-type Transistor Device |
| 4 | N2 | N-type Transistor Device |
| 4 | P2 | P-type Transistor Device |
| 4 | C1 | Capacitor device |
| 4 | C2 | Capacitor device |
| 4 | Cont1 | Optional Capacitor device Control Node |
| 4 | Cont2 | Optional Capacitor device Control Node |
| 4 | CE1 | Common Emitter Node |
| 4 | CE2 | Common Emitter Node |
| 4 | VD_N | High Power Supply |
| 4 | VD_P | Lower Power Supply |

First Embodiment

Figure 1:
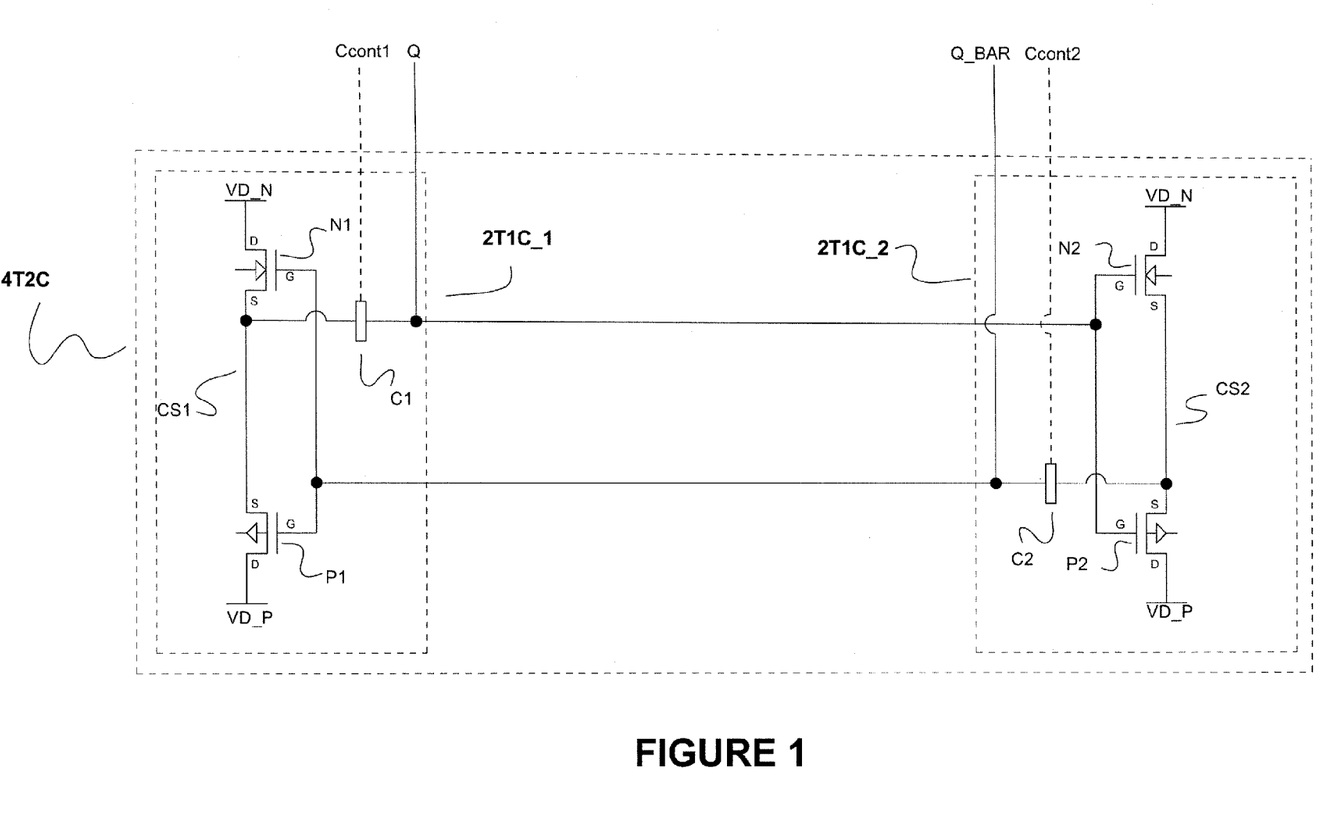
FIG. 1 is a transistor-level schematic of a four-transistor two-capacitor (4T2C) Radiation Single-Events-Effects (SEE) suppression device according to a first embodiment of the present invention.

FIG. 1

FIG. 1 is a transistor level circuit diagram showing a Four-Transistor Two-Capacitor Radiation Single-Event-Effects Suppression Device 4T2C according to a first embodiment of this invention.

The Four-Transistor Two-Capacitor Radiation Single-Event-Effects Suppression Device 4T2C includes a first Two-Transistor One-Capacitor Radiation Single-Event-Effects Suppression Device 2T1C_1, a second Two-Transistor One-Capacitor Radiation Single-Event-Effects Suppression Device 2T1C_2, a first optional capacitor device control line Cont1, a second optional capacitor device control line Cont2, a first Bi-Directional Input/Output terminal Q, and a second Bi-Directional Input/Output terminal Q_BAR.

The first Two-Transistor One-Capacitor Radiation Single-Event-Effects Suppression Device 2T1C_1 includes an N-type transistor device N1, a P-type transistor device P1, a capacitor device C1, a Common Source Terminal CS1, a high power supply node VD_N, and a low power supply node VD_P. The N-type transistor device N1 having a drain type terminal coupled to the high power supply node VD_N, a gate type terminal coupled to the Bi-Directional Input/Output terminal Q_BAR, and a source type terminal coupled to the Common Source Terminal CS1. The P-type transistor device P1 having a drain type terminal coupled to the low power supply node VD_P, a gate type terminal coupled to the Bi-Directional Input/Output terminal Q_BAR, and a source type terminal coupled to the Common Source Terminal CS1. The capacitor device C1 having a first terminal coupled to the Common Source Terminal CS1, a second terminal coupled to the Bi-Directional Input/Output terminal Q, and an optional capacitor device control terminal coupled to Ccont1.

The second Two-Transistor One-Capacitor Radiation Single-Event-Effects Suppression Device 2T1C_2 includes an N-type transistor device N2, a P-type transistor device P2, a capacitor device C2, a Common Source Terminal CS2, a high power supply node VD_N, and a low power supply node VD_P. The N-type transistor device N2 having a drain type terminal coupled to the high power supply node VD_N, a gate type terminal coupled to the Bi-Directional Input/Output terminal Q, and a source type terminal coupled to the Common Source Terminal CS2. The P-type transistor device P2 having a drain type terminal coupled to the low power supply node VD_P, a gate type terminal coupled to the Bi-Directional Input/Output terminal Q, and a source type terminal coupled to the Common Source Terminal CS2. The capacitor device C2 having a first terminal coupled to the Common Source Terminal CS2, a second terminal coupled to the Bi-Directional Input/Output terminal Q_BAR, and an optional capacitor device control terminal coupled to Ccont2.

The first and second Two-Transistor One-Capacitor Radiation Single-Event-Effects Suppression Devices 2T1C_1 and 2T1C_2 are symmetrical and have components with identical aspect ratios and values.

The operation of the first and second Two-Transistor One-Capacitor Radiation Single-Event-Effects Suppression Devices 2T1C_1 and 2T1C_2 are substantially the same when either static or variable capacitors are used.

The sizes of transistors will depend on the trans-conductance parameters of individual wafer foundries.

The size of capacitors will depend on parameters of individual wafer foundries and the expected magnitude and duration of Single-Event-Effects (SEE). The capacitors need to retain enough charge, after the Single-Event-Effects have subsided, to "remember" the original state of the bi-stable circuit.

The Four-Transistor Two-Capacitor Radiation Single-Event-Effects Suppression Device 4T2C is a symmetrical device and therefore has the same operation with respect to either of the two possible orientations: the second terminal of capacitor device C1 coupled to Bi-Directional Input/Output Terminal Q and second terminal of capacitor device C2 coupled to Bi-Directional Input/Output Terminal Q_BAR, OR the second terminal of capacitor device C1 coupled to Bi-Directional Input/Output Terminal Q_BAR and second terminal of capacitor device C2 coupled to Bi-Directional Input/Output Terminal Q.

It does not matter what type of capacitor devices are used, as long as the capacitor device retains enough charge to "remember" the circuit's original state until after the Single-Event-Effect (SEE) subsides. The amount of capacitance that is required is based on the trans-conductance of the transistor-devices, which is dependent on the specific fabrication process, and the magnitude and duration of the expected Single-Event-Effect (SEE). The capacitor device may be a fixed value capacitor, or a variable value capacitor, which is the reason for the optional capacitor device control lines. The function of fixed value capacitor devices and variable value capacitor devices is substantially the same.

When the Four-Transistor Two-Capacitor Radiation Single-Event-Effects Suppression Device 4T2C is coupled to a bi-stable circuit, it protects the bi-stable circuit from unwanted and unknown changes in the bi-stable circuit's present state due to energy being deposited by incident radiation.

There are a total of eight possible scenarios in which incident radiation may affect a change in the present state of a bi-stable circuit. Four of the eight possible scenarios re-enforce the bi-stable circuit's present state producing no unwanted and unknown changes in the bi-stable circuit's present state, and therefore are of no interest as illustrated in Table 1, scenarios 5 through 8. Table 1, scenarios 1 through 4, represent occurrences where incident radiation can affect an un-wanted and un-known change in the bi-stable circuit's present state and therefore are of interest. Therefore the operational description of the Four-Transistor Two-Capacitor Radiation Single-Event-Effects Suppression Device 4T2C will be based on table 1, scenarios 1 through 4, describing how the Four-Transistor Two-Capacitor Radiation Single-Event-Effects Suppression Device 4T2C eliminates the adverse effects of incident radiation on bi-stable circuits.

TABLE 1

| Scenario | Node "Q" | Node "Q_BAR" | Strike Node | Polarity of Strike | Effect |
|---|---|---|---|---|---|
| 1 | High | Low | "Q" | Negative | Upset Possible |
| 2 | High | Low | "Q_BAR" | Positive | Upset Possible |
| 3 | Low | High | "Q" | Positive | Upset Possible |
| 4 | Low | High | "Q_BAR" | Negative | Upset Possible |
| 5 | High | Low | "Q" | Positive | Re-enforcing |
| 6 | High | Low | "Q_BAR" | Negative | Re-enforcing |
| 7 | Low | High | "Q" | Negative | Re-enforcing |
| 8 | Low | High | "Q_BAR" | Positive | Re-enforcing |

The High and Low, described for nodes "Q" and "Q_BAR" in table 1, are produced by the steady state of a bi-stable circuit that the Four-Transistor Two-Capacitor Radiation Single-Event-Effects Suppression Device 4T2C is coupled to, but not shown in this embodiment. Subsequent embodiments do show the same scenarios with examples of various bi-stable circuits. The Four-Transistor Two-Capacitor Radiation Single-Event-Effects Suppression Device 4T2C is initially best understood by itself without added complicating circuitry.

Table 1, Scenario 1 (Steady State):

Initial static conditions are node "Q" high and node "Q_BAR" low. The external bi-stable circuit settling in this present or static state brings about the particular static condition for this scenario:

A high on node "Q" turns on N-type transistor device N2, and turns off P-type transistor device P2 forcing node CS2 high. Note the configuration of the N-type transistor devices and P-type transistor devices are opposite to the normal inverter configuration.

With node CS2 high and node "Q_BAR" low, the first terminal (right) of C2 is charged high and the second terminal (left) of C2 is charged low.

A low on node "Q_BAR" turns on P-type transistor device P1, and turns off N-type transistor device N1 forcing node CS1 low.

With node CS1 low and node "Q" high, the first terminal (left) of C1 is charged low and the second terminal (right) of C1 is charged high.

Table 1, Scenario 1 (Steady State with Incident Radiation):

An energetic particle having a negative polarity and striking node "Q," pushes the voltage on node "Q" of the Four-Transistor Two-Capacitor Radiation Single-Event-Effects Suppression Device 4T2C from high to low producing the following result:

The node "Q" being forced from high to low due to incident radiation, charge pumps the voltage on node CS1 in the negative direction. The magnitude of the negative voltage on node CS1 is limited by the source to body diode connection of the N-type transistor device N1, which prevents Single-Event-Gate-Rupture (SEGR).

As the voltage on node CS1 goes negative due to the charge pumping of capacitor device C1, the source of the N-type transistor device N1 is pulled low producing a gate to source voltage sufficient enough to turn on the N-type transistor device N1, pulling the voltage at node CS1 back toward a high voltage level. This reverses the charge pumping action and forces the node "Q" toward its original high voltage state.

The low forced on node "Q," due to the incident radiation, has also simultaneously turned the P-type transistor device P2 on and the N-type transistor device N2 off.

As the P-type transistor device P2 turns on, node CS2 is brought low.

As node CS2 is brought low, the node "Q_BAR" is charged pumped low, which strongly re-enforces the original state of node "Q_BAR." The level of the negative charge pumping on the node "Q_BAR" would be limited by the drain to body diode connection of an N-type transistor device in the bi-stable circuit that is coupled to node "Q_BAR."

Table 1, Scenario 2 (Steady State):

Initial static conditions are node "Q" high and node "Q_BAR" low. The external bi-stable circuit settling in this present or static state brings about the particular static condition for this scenario:

A high on node "Q" turns on N-type transistor device N2, and turns off P-type transistor device P2 forcing node CS2 high. Note the configuration of the N-type transistor devices and P-type transistor devices are opposite to the normal inverter configuration.

With node CS2 high and node "Q_BAR" low, the first terminal (right) of C2 is charged high and the second terminal (left) of C2 is charged low.

A low on node "Q_BAR" turns on P-type transistor device P1, and turns off N-type transistor device N1 forcing node CS1 low.

With node CS1 low and node "Q" high, the first terminal (left) of C1 is charged low and the second terminal (right) of C1 is charged high.

Table 1, Scenario 2 (Steady State with Incident Radiation):

An energetic particle having a positive polarity and striking node "Q_BAR," pushes the voltage on node "Q_BAR" of the Four-Transistor Two-Capacitor Radiation Single-Event-Effects Suppression Device 4T2C from low to high producing the following result:

The node "Q_BAR" being forced from low to high due to incident radiation, charge pumps the voltage on node CS2 in the positive direction. The magnitude of the positive voltage on node CS2 is limited by the source to body diode connection of the P-type transistor device P2, which prevents Single-Event-Gate-Rupture (SEGR).

As the voltage on node CS2 goes positive due to the charge pumping of capacitor device C2, the source of the P-type transistor device P2 is pulled low producing a gate to source voltage sufficient enough to turn on the P-type transistor device P2, pulling the voltage at node CS2 back toward a low voltage level. This reverses the charge pumping action and forces the node "Q_BAR" toward its original low voltage state.

The high forced on node "Q_BAR," due to the incident radiation, has also simultaneously turned the N-type transistor device N1 on, and the N-type transistor device N2 off.

As the N-type transistor device N1 turns on, node CS1 is brought high.

As node CS1 is brought high, the node "Q" is charged pumped high, which strongly re-enforces the original state of node "Q." The level of the positive charge pumping on the node "Q" would be limited by the drain to body diode connection of a P-type transistor device in the bi-stable circuit that is coupled to node "Q."

Table 1, Scenario 3 (Steady State):

Initial static conditions are node "Q" low and node "Q_BAR" high. The external bi-stable circuit settling in this present or static state brings about the particular static condition for this scenario:

A low on node "Q" turns on P-type transistor device P2, and turns off N-type transistor device N2 forcing node CS2 low. Note the configuration of the N-type transistor devices and P-type transistor devices are opposite to the normal inverter configuration.

With node CS2 low and node "Q_BAR" high, the first terminal (right) of C2 is charged low and the second terminal (left) of C2 is charged high.

A high on node "Q_BAR" turns on N-type transistor device N1, and turns off P-type transistor device P1 forcing node CS1 high.

With node CS1 high and node "Q" low, the first terminal (left) of C1 is charged high and the second terminal (right) of C1 is charged low.

Table 1, Scenario 3 (Steady State with Incident Radiation):

An energetic particle having a positive polarity and striking node "Q," pushes the voltage on node "Q" of the Four-Transistor Two-Capacitor Radiation Single-Event-Effects Suppression Device 4T2C from low to high producing the following result:

The node "Q" being forced from low to high due to incident radiation, charge pumps the voltage on node CS1 in the positive direction. The magnitude of the positive voltage on node CS1 is limited by the source to body diode connection of the P-type transistor device P1, which prevents Single-Event-Gate-Rupture (SEGR).

As the voltage on node CS1 goes positive due to the charge pumping of capacitor device C1, the source of the P-type transistor device P1 is pulled high producing a gate to source voltage sufficient enough to turn on the P-type transistor device P1, pulling the voltage at node CS1 back toward a low voltage level. This reverses the charge pumping action and forces the node "Q" toward its original low voltage state.

The high forced on node "Q," due to the incident radiation, has also simultaneously turned the N-type transistor device N2 on and the P-type transistor device P2 off.

As the N-type transistor device N2 turns on, node CS2 is brought high.

As node CS2 is brought high, the node "Q_BAR" is charged pumped high, which strongly re-enforces the original state of node "Q_BAR." The level of the positive charge pumping on the node "Q_BAR" would be limited by the drain to body diode connection of an P-type transistor device in the bi-stable circuit that is coupled to node "Q_BAR."

Table 1, Scenario 4 (Steady State):

Initial static conditions are node "Q" low and node "Q_BAR" high. The external bi-stable circuit settling in this present or static state brings about the particular static condition for this scenario:

A low on node "Q" turns on P-type transistor device P2, and turns off N-type transistor device N2 forcing node CS2 low. Note the configuration of the N-type transistor devices and P-type transistor devices are opposite to the normal inverter configuration.

With node CS2 low and node "Q_BAR" high, the first terminal (right) of C2 is charged low and the second terminal (left) of C2 is charged high.

A high on node "Q_BAR" turns on N-type transistor device N1, and turns off P-type transistor device P1 forcing node CS1 high.

With node CS1 high and node "Q" low, the first terminal (left) of C1 is charged high and the second terminal (right) of C1 is charged low.

Table 1, Scenario 4 (Steady State with Incident Radiation):

An energetic particle having a negative polarity and striking node "Q_BAR," pushes the voltage on node "Q_BAR" of the Four-Transistor Two-Capacitor Radiation Single-Event-Effects Suppression Device 4T2C from high to low producing the following result:

The node "Q_BAR" being forced from high to low due to incident radiation, charge pumps the voltage on node CS2 in the negative direction. The magnitude of the negative voltage on node CS2 is limited by the source to body diode connection of the N-type transistor device N1, which prevents Single-Event-Gate-Rupture (SEGR).

As the voltage on node CS2 goes negative due to the charge pumping of capacitor device C2, the source of the N-type transistor device N2 is pulled low producing a gate to source voltage sufficient enough to turn on the N-type transistor device N2, pulling the voltage at node CS2 back toward a high voltage level. This reverses the charge pumping action and forces the node "Q_BAR" toward its original high voltage state.

The low forced on node "Q_BAR," due to the incident radiation, has also simultaneously turned the P-type transistor device P1 on and the N-type transistor device N1 off.

As the P-type transistor device P1 turns on, node CS1 is brought low.

As node CS1 is brought low, the node "Q" is charged pumped low, which strongly re-enforces the original state of node "Q." The level of the negative charge pumping on the node "Q" would be limited by the drain to body diode connection of an N-type transistor device in the bi-stable circuit that is coupled to node "Q."

Second Embodiment

Figure 2:
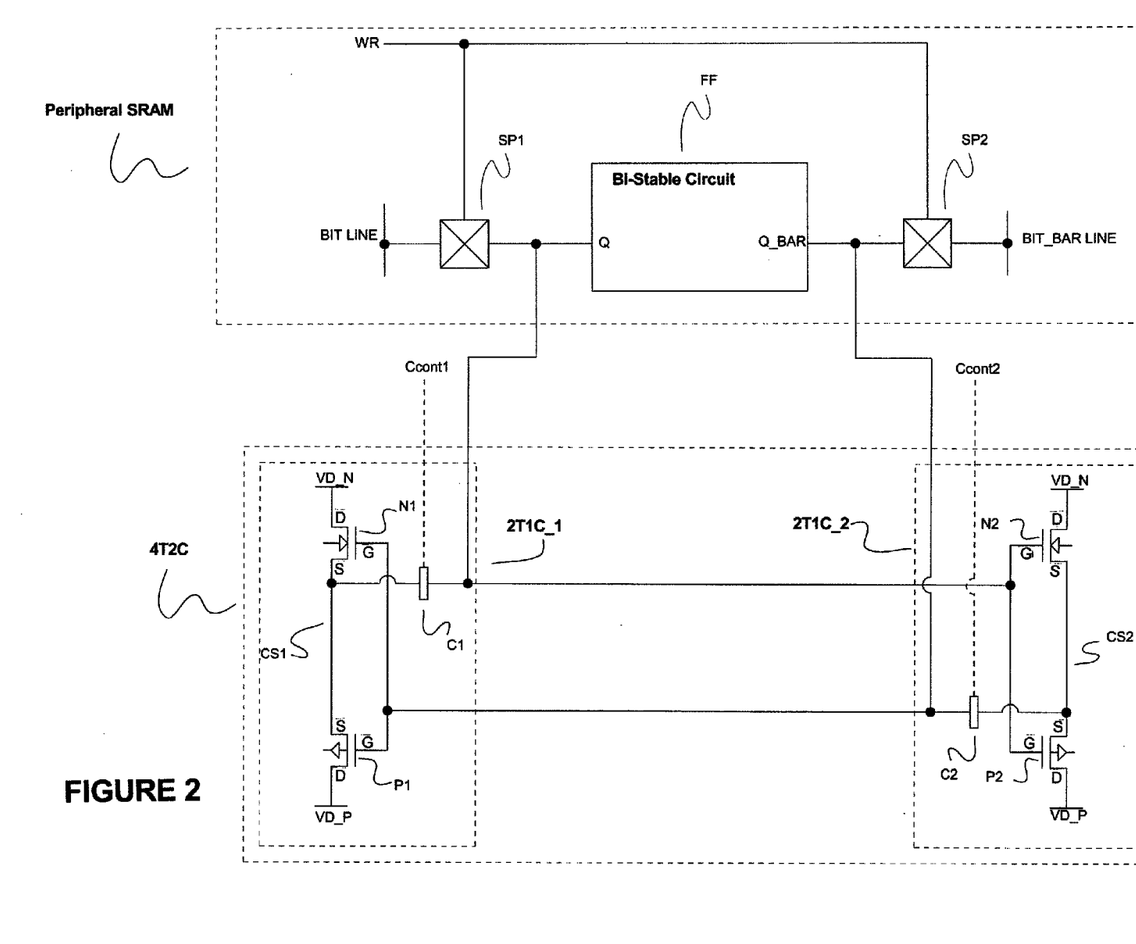
FIG. 2 is a block diagram of a peripheral bi-stable circuit in an SRAM circuit configuration and a transistor-level schematic of the four-transistor two-capacitor (4T2C) Radiation Single-Events-Effects (SEE) suppression device according to a second embodiment of the present invention.

FIG. 2

FIG. 2 is a block diagram of a peripheral bi-stable circuit in an SRAM circuit configuration Peripheral SRAM and a transistor level circuit diagram showing a Four-Transistor Two-Capacitor Radiation Single-Event-Effects Suppression Device 4T2C according to a second embodiment of this invention.

The Peripheral SRAM circuit includes a Bi-Stable Circuit FF, a first Series-Pass-Element SP1, a second Series-Pass-Element SP2, a Write/Read control line WR, a first Bi-Directional data line BIT LINE, and a second Bi-Directional data line BIT_BAR LINE. The Bi-Stable Circuit FF having a first Bi-Directional Input/Output terminal Q and a second Bi-Directional Input/Output terminal Q_BAR. The first Series-Pass-Element SP1 having an input control terminal coupled to WR, a first Bi-Directional Input/Output terminal coupled to Bi-Directional data line BIT LINE, and a second Bi-Directional Input/Output terminal coupled to the Bi-Directional Input/Output terminal Q. The Second Series-Pass-Element SP2 having an input control terminal coupled to WR, a first Bi-Directional Input/Output terminal coupled to Bi-Directional data line BIT_BAR LINE, and a second Bi-Directional Input/Output terminal coupled to the Bi-Directional Input/Output terminal Q_BAR.

The Four-Transistor Two-Capacitor Radiation Single-Event-Effects Suppression Device 4T2C includes a first Two-Transistor One-Capacitor Radiation Single-Event-Effects Suppression Device 2T1C_1, a second Two-Transistor One-Capacitor Radiation Single-Event-Effects Suppression Device 2T1C_2, a first optional capacitor device control line Cont1, a second optional capacitor device control line Cont2, a first Bi-Directional Input/Output terminal Q, and a second Bi-Directional Input/Output terminal Q_BAR.

The first Two-Transistor One-Capacitor Radiation Single-Event-Effects Suppression Device 2T1C_1 includes an N-type transistor device N1, a P-type transistor device P1, a capacitor device C1, a Common Source Terminal CS1, a high power supply node VD_N, and a low power supply node VD_P. The N-type transistor device N1 having a drain type terminal coupled to the high power supply node VD_N, a gate type terminal coupled to the Bi-Directional Input/Output terminal Q_BAR, and a source type terminal coupled to the Common Source Terminal CS1. The P-type transistor device P1 having a drain type terminal coupled to the low power supply node VD_P, a gate type terminal coupled to the Bi-Directional Input/Output terminal Q_BAR, and a source type terminal coupled to the Common Source Terminal CS1. The capacitor device C1 having a first terminal coupled to the Common Source Terminal CS1, a second terminal coupled to the Bi-Directional Input/Output terminal Q, and an optional capacitor device control terminal coupled to Ccont1.

The second Two-Transistor One-Capacitor Radiation Single-Event-Effects Suppression Device 2T1C_2 includes an N-type transistor device N2, a P-type transistor device P2, a capacitor device C2, a Common Source Terminal CS2, a high power supply node VD_N, and a low power supply node VD_P. The N-type transistor device N2 having a drain type terminal coupled to the high power supply node VD_N, a gate type terminal coupled to the Bi-Directional Input/Output terminal Q, and a source type terminal coupled to the Common Source Terminal CS2. The P-type transistor device P2 having a drain type terminal coupled to the low power supply node VD_P, a gate type terminal coupled to the Bi-Directional Input/Output terminal Q, and a source type terminal coupled to the Common Source Terminal CS2. The capacitor device C2 having a first terminal coupled to the Common Source Terminal CS2, a second terminal coupled to the Bi-Directional Input/Output terminal Q_BAR, and an optional capacitor device control terminal coupled to Ccont2.

The first and second Two-Transistor One-Capacitor Radiation Single-Event-Effects Suppression Devices 2T1C_1 and 2T1C_2 are symmetrical and have components with identical aspect ratios and values.

The operation of the first and second Two-Transistor One-Capacitor Radiation Single-Event-Effects Suppression Devices 2T1C_1 and 2T1C_2 are substantially the same when either static or variable capacitors are use.

The sizes of transistors will depend on the trans-conductance parameters of individual wafer foundries.

The size of capacitors will depend on parameters of individual wafer foundries and the expected magnitude and duration of Single-Event-Effects. The capacitors need to retain enough charge, after the Single-Event-Effects have subsided, to "remember" the original state of the bi-stable circuit.

The operation of the circuit depicted in the block diagram of FIG. 2, Peripheral SRAM, is well known within the art.

The operation of the circuit depicted in the block diagram of FIG. 2, Four-Transistor Two-Capacitor Radiation Single-Event-Effects Suppression Device 4T2C, is substantially the same as the operation described for the Four-Transistor Two-Capacitor Radiation Single-Event-Effects Suppression Device 4T2C in the FIRST EMBODIMENT.

The Two-Transistor One-Capacitor Radiation Single-Event-Effects Suppression Device 2T1C is very useful as a circuit architecture without being included in a Four-Transistor Two-Capacitor Radiation Single-Event-Effects Suppression Device 4T2C. The Two-Transistor One-Capacitor Radiation Single-Event-Effects Suppression Device 2T1C protects against the effects of incident radiation strongly in one direction and weakly in the other direction, when coupled to a bi-stable circuit, which has two stable states or two possible directions for data/state storage. This makes the Two-Transistor One-Capacitor Radiation Single-Event-Effects Suppression Device 2T1C circuit architecture an optimal circuit architecture used, in conjunction with a bi-stable circuit, as a radiation sensor that senses a Single-Event-Upset (SEU) and safely stores the condition that resulted in the Single-Event-Upset (SEU) event. When a Two-Transistor One-Capacitor Radiation Single-Event-Effects Suppression Device 2T1C and the bi-stable circuit is biased in a weak and known state, and a radioactive ion strikes causing a Single-Event-Upset (SEU) is incident on the circuit, the Single-Event-Upset (SEU) forces the circuit to change from one state, which was originally biased so that the circuit was weak against Single-Event-Upsets (SEU), to the other bi-stable state, which automatically puts the Two-Transistor One-Capacitor Radiation Single-Event-Effects Suppression Device 2T1C and the bi-stable circuit it is coupled to, into a very strongly protected state against Single-Event-Upset (SEU) events. The Two-Transistor One-Capacitor Radiation Single-Event-Effects Suppression Device 2T1C, and the bi-stable circuit it is coupled to, now stores the state that indicates a Single-Event-Upset (SEU) occurred and that state can be used by the system, the Two-Transistor One-Capacitor Radiation Single-Event-Effects Suppression Device 2T1C and bi-stable circuit is embedded in, to alert other parts of the system thus allowing system to react if necessary. The actual biasing of the Two-Transistor One-Capacitor Radiation Single-Event-Effects Suppression Device 2T1C and bi-stable circuit may be arbitrary, and depends on the fact that the probability of an equal and oppositely charged ion striking the same node that was previously struck, thus resetting the circuit to it's original state and thus masking that a Single-Event-Upset (SEU) occurred, in such a time that is faster than the governing system operates, is so low, that the probability of this event occurring may be ignored. The probability of this "resetting" event may be practically eliminated by the addition of a second Two-Transistor One-Capacitor Radiation Single-Event-Effects Suppression Device 2T1C coupled to a bi-stable circuit, also acting as a sensor. It is recommended that the number of Two-Transistor One-Capacitor Radiation Single-Event-Effects Suppression Devices 2T1C coupled to their respective bi-stable circuits, be enough to cover an area sufficiently large enough to detect Single-Event-Upset (SEU) events based on the rate or frequency of ion strikes, which are well known for various orbits in space.

An example of the construction of the Two-Transistor One-Capacitor Radiation Single-Event-Effects Suppression Device 2T1C coupled to a bi-stable circuit is illustrated in FIG. 2 by excluding the Two-Transistor One-Capacitor Radiation Single-Event-Effects Suppression Device 2T1C_2.

TABLE 2

| Cell Under Test | Result | Q | Q_BAR | Polarity | SEU Event Strike Node | Pulse Width Seconds | Current Amps | Total Deposited Charge Coulombs | Percent Improvement Over Native SRAM Cell |
|---|---|---|---|---|---|---|---|---|---|
| Peripheral SRAM Cell without the Two-Transistor One-Capacitor Radiation Effects Suppression Circuits 2T1C_1 and 2T1C_2 | 1 | L | H | POS | Q | 1.62E−10 | 4.55E−05 | 7.37E−15 | NA |
|  | 2 | H | L | POS | Q_BAR | 1.62E−10 | 4.55E−05 | 7.37E−15 | NA |
|  | 3 | H | L | NEG | Q | 1.62E−10 | 6.45E−05 | 1.04E−14 | NA |
|  | 4 | L | H | NEG | Q_BAR | 1.62E−10 | 6.45E−05 | 1.04E−14 | NA |
| Peripheral SRAM Cell only with the Two-Transistor One-Capacitor Radiation Effects Suppression Circuits 2T1C_1 | 1 | L | H | POS | Q | 1.62E−10 | 1.00E+02 | 1.62E−08 | 219,809,900% |
|  | 2 | H | L | POS | Q_BAR | 1.62E−10 | 2.36E−04 | 3.83E−14 | 420% |
|  | 3 | H | L | NEG | Q | 1.62E−10 | 2.35E+01 | 3.81E−09 | 36,634,520% |
|  | 4 | L | H | NEG | Q_BAR | 1.62E−10 | 1.19E−03 | 1.92E−13 | 1,746% |
| Peripheral SRAM Cell only with the Two-Transistor One-Capacitor Radiation Effects Suppression Circuits 2T1C_2 | 1 | L | H | POS | Q | 1.62E−10 | 2.36E−04 | 3.83E−14 | 420% |
|  | 2 | H | L | POS | Q_BAR | 1.62E−10 | 1.00E+02 | 1.62E−08 | 219,809,900% |
|  | 3 | H | L | NEG | Q | 1.62E−10 | 1.19E−03 | 1.92E−13 | 1,746% |
|  | 4 | L | H | NEG | Q_BAR | 1.62E−10 | 2.35E+01 | 3.81E−09 | 36,634,520% |

Table 2 shows the simulated results of three circuits architectures. The first is the Peripheral SRAM without the Two-Transistor One-Capacitor Radiation Single-Event-Effects Suppression Device 2T1C_1 and without the Two-Transistor One-Capacitor Radiation Single-Event-Effects Suppression Device 2T1C_2. This circuit architecture provides baseline data. The second is the Peripheral SRAM with the Two-Transistor One-Capacitor Radiation Single-Event-Effects Suppression Device 2T1C_1 and without the Two-Transistor One-Capacitor Radiation Single-Event-Effects Suppression Device 2T1C_2. The third is the Peripheral SRAM without the Two-Transistor One-Capacitor Radiation Single-Event- Effects Suppression Device 2T1C_1 and with the Two-Transistor One-Capacitor Radiation Single-Event-Effects Suppression Device 2T1C_2.

The first circuit architecture, the standalone Peripheral SRAM, shows that a Single-Event-Upset (SEU) depositing 7.37 fC of positive charge on a node that is LOW, or 10.4 fC of negative charge on a node that is high, causes the Peripheral SRAM to perform an unwanted state change. It is interesting to note that alpha particles found terrestrially can generate these levels of charge, making the Two-Transistor One-Capacitor Radiation Single-Event-Effects Suppression Device 2T1C and Four-Transistor Two-Capacitor Radiation Single-Event-Effects Suppression Device 4T2C circuit architectures quite suited for use on the planet's surface as well as in space.

The second circuit architecture, the Peripheral SRAM having the Two-Transistor One-Capacitor Radiation Single-Event-Effects Suppression Device 2T1C_1 coupled to it, shows that in comparison, to the first circuit architecture of the standalone Peripheral SRAM, the required charge from a Single-Event-Upset (SEU) to perform an unwanted change in the state of the Peripheral SRAM, has been increased from the baseline of 0% to 219,780,120% depending on the circuit's initial conditions, the charge polarity of the incident ion, and the polarity of the node that incident ion strikes. In the second configuration of the Two-Transistor One-Capacitor Radiation Single-Event-Effects Suppression Device 2T1C_1 coupled to the Peripheral SRAM, having "Q" node high and the "Q_BAR" node low as in Table 2, conditions the circuit to easily sense the effects of a positively charged ion incident on the low node "Q_BAR," causing an unwanted state change by depositing 38.3 fC of charge or more. Since most features of radiation hardened integrated circuits are protected against incident ions that deposit much greater than 38.3 fC, this circuit architecture is therefore sensitive enough to alert the system it is embedded in, to the presence of ionic activity. For example when a satellite passes through various layers of the Van Allen Belts, or during increased Solar Flare Activity, the ions effecting electronic integrated circuits have energies such that they deposit greater than 1 pC of charge, which is three orders of magnitude greater charge than is required for this architecture to sense the presence of incident ions. According to Table 2, when this second circuit configuration is set with "Q" node high and the "Q_BAR" node low, the node "Q_BAR" is sensitive to positive ions, while negative ions incident on node "Q_BAR" re-enforce the present state and would not record the presence of incident ions. In this second circuit configuration, the node "Q," being set high, is highly resistant to both positive and negative ions, due to positive ions reinforcing the present state and negative ions requiring 36 million % greater energy, or 3.81 nC (six orders of magnitude greater deposited charge) to produce an unwanted state change or Single-Event-Upset. Therefore, the second circuit configuration, with "Q" node high and the "Q_BAR" node low, is optimized for use as a positive ion detector. Once the Single-Event-Upset has been detected by switching node "Q_BAR" from low to high, the circuit can be only changed back to it's original state by the system resetting it, or by having a negative ion striking "Q_BAR" with a minimum of 192 fC of deposited charge. An ion resetting the detector is unlikely. The reason it is unlikely for a negative ion to reset the second circuit configuration after it has been set by a Single-Event-Upset, by striking the node "Q_BAR" with a negatively charged ion, is the probability of a negatively charged ion hitting the same area as a positively charged ion, within the time-frame that the system checks for this event, is very highly improbable. The addition of a second similar circuit with the same bias conditions and monitored the same way, will virtually eliminate the possibility of the scenario of a negatively charged ion resetting the detector after it has been set by a positively charged ion, due to the probability of this scenario happening to two separate circuits during the same time period is practically infinite. The scenario of this second circuit configuration being used as a negative ion detector is substantially the same as it's use as a detector for positively charged ions as explained above, with the exception that the required deposited charge of an incident negative ion on node "Q_BAR" must be greater than or equal to 19.2 fC, which is roughly four time greater than is required for a positive ion to be sensed with the same circuit configuration. However this is not a concern since the average charge deposited by ions being sensed, is generally at least three orders of magnitude greater than the required charge deposition to activate this sensing circuit.

The third circuit architecture, depicted in Table 2, the Peripheral SRAM having the Two-Transistor One-Capacitor Radiation Single-Event-Effects Suppression Device 2T1C_2 coupled to it, shows substantially the same operation as the second circuit architecture explained above, with the exception that the node "Q" is sensitized for sensing ionic activity whereas in the second circuit architecture the node "Q_BAR" was sensitized for sensing ionic activity. Since the Peripheral SRAM is symmetrical in design, the definition or notation of nodes "Q" and "Q_BAR" are irrelevant as long as they are defined within the system in which they are embedded.

Third Embodiment

Figure 3:
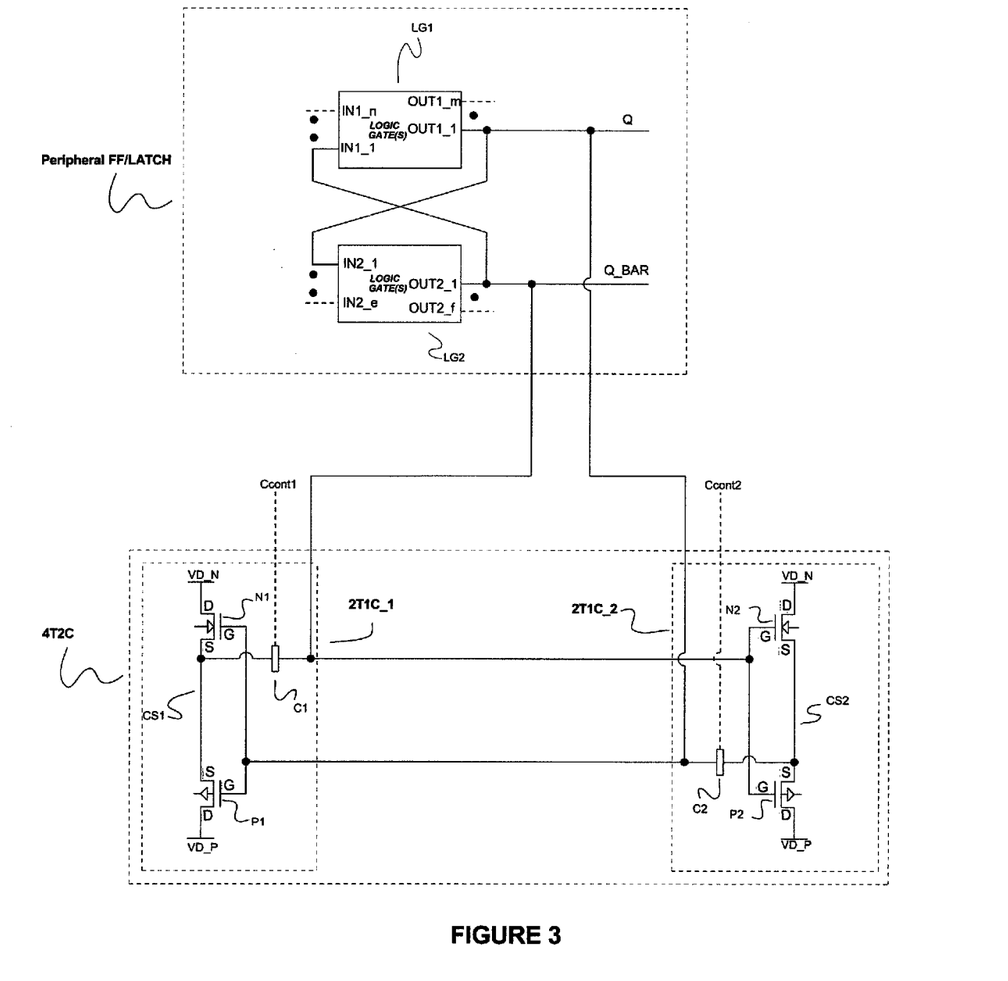
FIG. 3 is a block diagram of a peripheral bi-stable circuit in a Flip-Flop or Latch circuit configuration and a transistor-level schematic of the four-transistor two-capacitor (4T2C) Radiation Single-Event-Effects (SEE) suppression device according to a third embodiment of the present invention.

FIG. 3

FIG. 3 is a block diagram of a peripheral bi-stable circuit in a Flip-Flop or Latch circuit configuration Peripheral FF/LATCH and a transistor level circuit diagram showing a Four-Transistor Two-Capacitor Radiation Single-Event-Effects Suppression Device 4T2C according to a third embodiment of this invention.

The peripheral FF/LATCH circuit includes a first LOGIC GATE(S) LG1, a second LOGIC GATE(S) LG2, a first output terminal Q, and a second output terminal Q_BAR. The first LOGIC GATE(S) LG1 having a first input IN1_1 coupled to the output terminal Q_BAR, zero (0) to "n" additional optional inputs, an output OUT1_1 coupled to the output terminal Q, and zero (0) to "m" additional optional outputs. The second LOGIC GATE(S) LG2 having a first input IN2_1 coupled to the output terminal Q, zero (0) to "e" additional optional inputs, an output OUT2_1 coupled to the output terminal Q_BAR, and zero (0) to "f" additional optional outputs.

The Four-Transistor Two-Capacitor Radiation Single-Event-Effects Suppression Device 4T2C includes a first Two-Transistor One-Capacitor Radiation Single-Event-Effects Suppression Device 2T1C_1, a second Two-Transistor One-Capacitor Radiation Single-Event-Effects Suppression Device 2T1C_2, a first optional capacitor device control line Cont1, a second optional capacitor device control line Cont2, a first Bi-Directional Input/Output terminal Q, and a second Bi-Directional Input/Output terminal Q_BAR.

The first Two-Transistor One-Capacitor Radiation Single-Event-Effects Suppression Device 2T1C_1 includes an N-type transistor device N1, a P-type transistor device P1, a capacitor device C1, a Common Source Terminal CS1, a high power supply node VD_N, and a low power supply node VD_P. The N-type transistor device N1 having a drain type terminal coupled to the high power supply node VD_N, a gate type terminal coupled to the Bi-Directional Input/Output terminal Q_BAR, and a source type terminal coupled to the Common Source Terminal CS1. The P-type transistor device P1 having a drain type terminal coupled to the low power supply node VD_P, a gate type terminal coupled to the Bi-Directional Input/Output terminal Q_BAR, and a source type terminal coupled to the Common Source Terminal CS1. The capacitor device C1 having a first terminal coupled to the Common Source Terminal CS1, a second terminal coupled to the Bi-Directional Input/Output terminal Q, and an optional capacitor device control terminal coupled to Ccont1.

The second Two-Transistor One-Capacitor Radiation Single-Event-Effects Suppression Device 2T1C_2 includes an N-type transistor device N2, a P-type transistor device P2, a capacitor device C2, a Common Source Terminal CS2, a high power supply node VD_N, and a low power supply node VD_P. The N-type transistor device N2 having a drain type terminal coupled to the high power supply node VD_N, a gate type terminal coupled to the Bi-Directional Input/Output terminal Q, and a source type terminal coupled to the Common Source Terminal CS2. The P-type transistor device P2 having a drain type terminal coupled to the low power supply node VD_P, a gate type terminal coupled to the Bi-Directional Input/Output terminal Q, and a source type terminal coupled to the Common Source Terminal CS2. The capacitor device C2 having a first terminal coupled to the Common Source Terminal CS2, a second terminal coupled to the Bi-Directional Input/Output terminal Q_BAR, and an optional capacitor device control terminal coupled to Ccont2.

The first and second Two-Transistor One-Capacitor Radiation Single-Event-Effects Suppression Devices 2T1C_1 and 2T1C_2 are symmetrical and have components with identical aspect ratios and values.

The operation of the first and second Two-Transistor One-Capacitor Radiation Single-Event-Effects Suppression Devices 2T1C_1 and 2T1C_2 are substantially the same when either static or variable capacitors are use.

The sizes of transistors will depend on the trans-conductance parameters of individual wafer foundries.

The size of capacitors will depend on parameters of individual wafer foundries and the expected magnitude and duration of Single-Event-Effects. The capacitors need to retain enough charge, after the Single-Event-Effects have subsided, to "remember" the original state of the bi-stable circuit.

The LOGIC GATE(S) LG1 and LG2 may take the form of inverters (as in the SRAM example in FIG. 2), AND gates, NAND gates, OR gates, NOR gates, Exclusive OR gates, Exclusive NOR gates, and multi-function gates, with the Four-Transistor Two-Capacitor Radiation Single-Event-Effects Suppression Device 4T2C having substantially the same operation. The number of optional inputs and optional outputs of the LOGIC GATE(S) LG1 and LG2 is based on the composition of the internal logic of the LOGIC GATE(S) LG1 and LG2.

Operation

Third Embodiment—FIG. 3

The operation of the circuit depicted in the block diagram of FIG. 3, Peripheral FF/LATCH, is well known within the art.

The operation of the circuit depicted in the block diagram of FIG. 3, Four-Transistor Two-Capacitor Radiation Single-Event-Effects Suppression Device 4T2C, is substantially the same as the operation described for the Four-Transistor Two-Capacitor Radiation Single-Event-Effects Suppression Device 4T2C in the FIRST EMBODIMENT.

DETAILED DESCRIPTION

Figure 4:
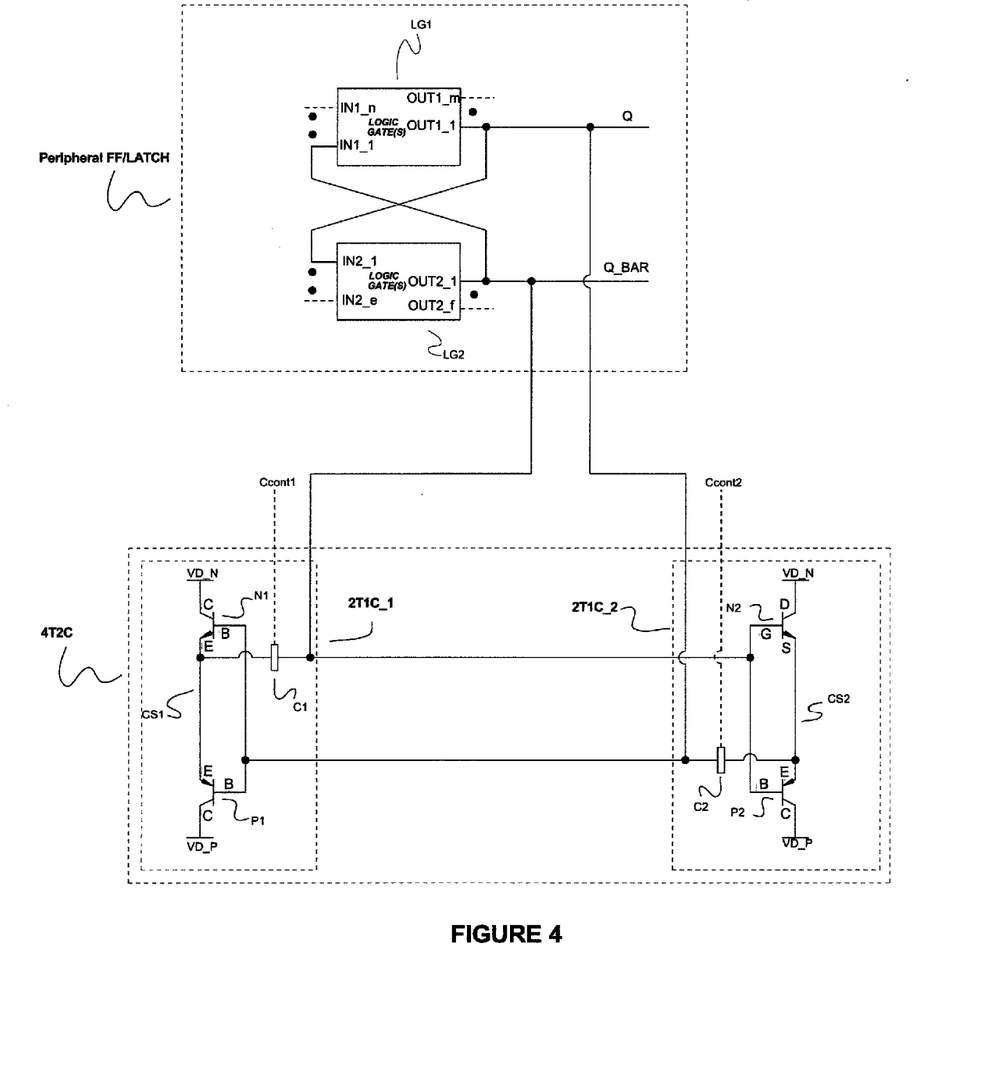
FIG. 4 is a block diagram of a peripheral bi-stable circuit in a Flip-Flop or Latch circuit configuration and a transistor-level schematic of the four-transistor two-capacitor (4T2C) Radiation Single-Event-Effects (SEE) suppression device according to a fourth embodiment of the present invention.

Fourth Embodiment—FIG. 4

FIG. 4 is a block diagram of a peripheral bi-stable circuit in a Flip-Flop or Latch circuit configuration Peripheral FF/LATCH and a transistor level circuit diagram showing a Four-Transistor Two-Capacitor Radiation Single-Event-Effects Suppression Device 4T2C according to a fourth embodiment of this invention.

The peripheral FF/LATCH circuit includes a first LOGIC GATE(S) LG1, a second LOGIC GATE(S) LG2, a first output terminal Q, and a second output terminal Q_BAR. The first LOGIC GATE(S) LG1 having a first input IN1_1 coupled to the output terminal Q_BAR, zero (0) to "n" additional optional inputs, an output OUT1_1 coupled to the output terminal Q, and zero (0) to "m" additional optional outputs. The second LOGIC GATE(S) LG2 having a first input IN2_1 coupled to the output terminal Q, zero (0) to "e" additional optional inputs, an output OUT2_1 coupled to the output terminal Q_BAR, and zero (0) to "f" additional optional outputs.

The Four-Transistor Two-Capacitor Radiation Single-Event-Effects Suppression Device 4T2C includes a first Two-Transistor One-Capacitor Radiation Single-Event-Effects Suppression Device 2T1C_1, a second Two-Transistor One-Capacitor Radiation Single-Event-Effects Suppression Device 2T1C_2, a first optional capacitor device control line Cont1, a second optional capacitor device control line Cont2, a first Bi-Directional Input/Output terminal Q, and a second Bi-Directional Input/Output terminal Q_BAR.

The first Two-Transistor One-Capacitor Radiation Single-Event-Effects Suppression Device 2T1C_1 includes an N-type transistor device N1, a P-type transistor device P1, a capacitor device C1, a Common Emitter Terminal CE1, a high power supply node VD_N, and a low power supply node VD_P. The N-type transistor device N1 having a collector type terminal coupled to the high power supply node VD_N, a base type terminal coupled to the Bi-Directional Input/Output terminal Q_BAR, and an emitter type terminal coupled to the Common Emitter Terminal CE1. The P-type transistor device P1 having a collector type terminal coupled to the low power supply node VD_P, a base type terminal coupled to the Bi-Directional Input/Output terminal Q_BAR, and an emitter type terminal coupled to the Common Emitter Terminal CE1. The capacitor device C1 having a first terminal coupled to the Common Emitter Terminal CE1, a second terminal coupled to the Bi-Directional Input/Output terminal Q, and an optional capacitor device control terminal coupled to Ccont1.

The second Two-Transistor One-Capacitor Radiation Single-Event-Effects Suppression Device 2T1C_2 includes an N-type transistor device N2, a P-type transistor device P2, a capacitor device C2, a Common Emitter Terminal CE2, a high power supply node VD_N, and a low power supply node VD_P. The N-type transistor device N2 having a collector type terminal coupled to the high power supply node VD_N, a base type terminal coupled to the Bi-Directional Input/Output terminal Q, and an emitter type terminal coupled to the Common Emitter Terminal CE2. The P-type transistor device P2 having a collector type terminal coupled to the low power supply node VD_P, a base type terminal coupled to the Bi-Directional Input/Output terminal Q, and an emitter type terminal coupled to the Common Emitter Terminal CE2. The capacitor device C2 having a first terminal coupled to the Common Emitter Terminal CE2, a second terminal coupled to the Bi-Directional Input/Output terminal Q_BAR, and an optional capacitor device control terminal coupled to Ccont2.

The first and second Two-Transistor One-Capacitor Radiation Single-Event-Effects Suppression Devices 2T1C_1 and 2T1C_2 are symmetrical and have components with identical aspect ratios and values.

The operation of the first and second Two-Transistor One-Capacitor Radiation Single-Event-Effects Suppression Devices 2T1C_1 and 2T1C_2 are substantially the same when either static or variable capacitors are use.

The sizes of transistors will depend on the trans-conductance parameters of individual wafer foundries.

The size of capacitors will depend on parameters of individual wafer foundries and the expected magnitude and duration of Single-Event-Effects. The capacitors need to retain enough charge, after the Single-Event-Effects have subsided, to "remember" the original state of the bi-stable circuit.

The LOGIC GATE(S) LG1 and LG2 may take the form of inverters (as in the SRAM example in FIG. 2), AND gates, NAND gates, OR gates, NOR gates, Exclusive OR gates, Exclusive NOR gates, and multi-function gates, with the Four-Transistor Two-Capacitor Radiation Single-Event-Effects Suppression Device 4T2C having substantially the same operation. The number of optional inputs and optional outputs of the LOGIC GATE(S) LG1 and LG2 is based on the composition of the internal logic of the LOGIC GATE(S) LG1 and LG2.

Operation

Fourth Embodiment—FIG. 4

The operation of the circuit depicted in the block diagram of FIG. 4, Peripheral FF/LATCH, is well known within the art.

The operation of the circuit depicted in the block diagram of FIG. 4, Four-Transistor Two-Capacitor Radiation Single-Event-Effects Suppression Device 4T2C, is substantially the same as the operation described for the Four-Transistor Two-Capacitor Radiation Single-Event-Effects Suppression Device 4T2C in the FIRST EMBODIMENT.

While certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. A Single-Event-Effects Suppression Device comprising:
a high power supply node and a low power supply node;
a bi-directional input/output terminal;
an N-type device and a P-type device, each having first and second terminals and a control terminal, conduction between the first and second terminals being responsive to the voltage between the first terminal and the control terminal;
a capacitor;
the first terminal of the N-type device and the P-type device being connected together and through the capacitor to the first bi-directional input/output terminal;
the control terminals of the first N-type and first P-type devices being coupled together;
the second terminal of the N-type device being connected to the high power supply node;
the second terminal of the P-type device being connected to the low power supply node.

2. The Single-Event-Effects Suppression Device of claim 1 wherein the N-type device is a field effect transistor, the body of the N-type device being connected to the low power supply node.

3. The Single-Event-Effects Suppression Device of claim 1 wherein the P-type device is a field effect transistor, the body of the P-type device being connected to the high power supply node.

4. The Single-Event-Effects Suppression Device of claim 1 wherein the N-type device is a bi-polar transistor.

5. The Single-Event-Effects Suppression Device of claim 1 wherein the P-type device is a bi-polar transistor.

6. The Single-Event-Effects Suppression Device of claim 1 wherein the capacitor is a fixed capacitance capacitor.

7. The Single-Event-Effects Suppression Device of claim 1 wherein the capacitor is a variable capacitance capacitor.

8. The Single-Event-Effects Suppression Device of claim 1 further comprising:
an SRAM device having a Bi-Stable Circuit having first and second input/output terminals, the first input/terminal being coupled to the first bi-directional input/output terminal;
a first Series-Pass-Element connected between said first input/output terminal of said Bi-Stable Circuit and a first bit line, said first Series-Pass-Element having a conduction state controlled by a write/read line; and
a second Series-Pass-Element, connected between said second input/output terminal of said Bi-Stable Circuit and a second bit line, said second Series-Pass-Element having a conduction state controlled by said write/read line.

9. The Single-Event-Effects Suppression Device of claim 1 further comprising:
a latch having a first input/output terminal coupled to the first bi-directional input/output terminal;
a second input/output terminal;
a first logic gate block having a first input coupled to said second input/output terminal, and a second output coupled to said first input/output terminal; and
a second logic gate block having a second input coupled to said first input/output terminal, and a second output coupled to said second bi-directional input/output terminal.

10. The Single-Event-Effects Suppression Device of claim 9 wherein the latch is comprised of logic gates selected from the group consisting of inverters, AND gates, NAND gates, OR gate, NOR gate, exclusive OR gate, exclusive NOR gate and multi-function logic gates.

11. The Single-Event-Effects Suppression Device of claim 9 wherein the latch includes additional input/output terminals.

12. A Single-Event-Effects Suppression Device comprising:
a high power supply node and a low power supply node;
first and second bi-directional input/output terminals;
first and second N-type devices and first and second P-type devices, each having first and second terminals and a control terminal, conduction between the first and second terminals being responsive to the voltage between the first terminal and the control terminal;
first and second capacitors;
the first terminals of the first N-type device and the first P-type device being connected together and through the first capacitor to the first bi-directional input/output terminal and a common connection of the control terminals of the second N-type and second P-type devices;

the first terminals of the second N-type device and the second P-type device being connected together and through the second capacitor to the second bi-directional input/output terminal and a common connection of the control terminals of the first N-type and first P-type devices;

the second terminal of the first and second N-type devices being connected to the high power supply node;

the second terminal of the first and second P-type devices being connected to the low power supply node.

13. The Single-Event-Effects Suppression Device of claim 12 wherein the N-type devices are field effect transistors, bodies of the first and second N-type devices being connected to the low power supply node.

14. The Single-Event-Effects Suppression Device of claim 12 wherein the P-type devices are field effect transistors, bodies of the first and second P-type devices being connected to the high power supply node.

15. The Single-Event-Effects Suppression Device of claim 12 wherein the N-type devices are bi-polar transistors.

16. The Single-Event-Effects Suppression Device of claim 12 wherein the P-type devices are bi-polar transistors.

17. The Single-Event-Effects Suppression Device of claim 12 wherein the capacitors are fixed capacitance capacitors.

18. The Single-Event-Effects Suppression Device of claim 12 wherein the capacitors are variable capacitance capacitors.

19. The Single-Event-Effects Suppression Device of claim 12 further comprising:

an SRAM device having a Bi-Stable Circuit having a first and second input/output terminals coupled to the first and second bi-directional input/output terminals, respectively;

a first Series-Pass-Element connected between said first bi-directional input/output terminal of said Bi-Stable Circuit and a first bit line, said first Series-Pass-Element having a conduction state controlled by a write/read line; and a second Series-Pass-Element, connected between said second bi-directional input/output terminal of said Bi-Stable Circuit and a second bit line, said second Series-Pass-Element having a conduction state controlled according to the potential of said write/read line.

20. The Single-Event-Effects Suppression Device of claim 12 further comprising:

a latch having a first input/output terminal coupled to the first bi-directional input/output terminal;

a second input/output terminal coupled to the second bi-directional input/output terminal;

a first logic gate block having a first input coupled to said second input/output terminal, and a second output coupled to said first input/output terminal; and a second logic gate block having a second input coupled to said first input/output terminal, and a second output coupled to said second bi-directional input/output terminal.

21. The Single-Event-Effects Suppression Device of claim 20 wherein the latch is comprised of logic gates selected from the group consisting of inverters, AND gates, NAND gates, OR gate, NOR gate, exclusive OR gate, exclusive NOR gate and multi-function logic gates.

22. The Single-Event-Effects Suppression Device of claim 20 wherein the latch includes additional input/output terminals.

* * * * *